United States Patent
Wu et al.

(10) Patent No.: US 7,515,009 B2
(45) Date of Patent: Apr. 7, 2009

(54) OSCILLATING APPARATUS WITH ADJUSTABLE OSCILLATING FREQUENCY

(75) Inventors: Wen-Chi Wu, Tao-Yuan (TW); Yao-Ching Wang, Chang-Hua Hsien (TW); Chi-Mo Huang, Hsin-Chu (TW)

(73) Assignee: Ili Technology Corp., Jhubei, Hsinchu County (TW)

( * ) Notice: Subject to any disclaimer, the term of this patent is extended or adjusted under 35 U.S.C. 154(b) by 68 days.

(21) Appl. No.: 11/554,040

(22) Filed: Oct. 30, 2006

(65) Prior Publication Data

US 2008/0111645 A1 May 15, 2008

(51) Int. Cl.
*H03L 7/099* (2006.01)

(52) U.S. Cl. ............... 331/185; 331/16; 331/113 R

(58) Field of Classification Search .............. 331/16, 331/34, 113 R, 185, 186
See application file for complete search history.

(56) References Cited

U.S. PATENT DOCUMENTS

| | | | |
|---|---|---|---|
| 6,680,656 B2 * | 1/2004 | Chen | 331/143 |
| 7,102,437 B2 * | 9/2006 | Perry | 330/259 |
| 7,233,214 B2 * | 6/2007 | Kim et al. | 331/176 |
| 7,327,201 B2 * | 2/2008 | Miyashita et al. | 331/185 |
| 2005/0231283 A1 | 10/2005 | Perry | |
| 2006/0033591 A1 | 2/2006 | Kim | |

* cited by examiner

*Primary Examiner*—Benny Lee
*Assistant Examiner*—Levi Gannon
(74) *Attorney, Agent, or Firm*—Winston Hsu

(57) ABSTRACT

The present invention relates to an oscillating apparatus. The oscillating apparatus includes a biasing circuit, a multi-vibrator, a detecting circuit, and a selecting circuit. The biasing circuit is for generating a bias signal, wherein the biasing circuit includes a connecting port for using an impedance device to control an oscillating frequency or for directly connecting to external clock source as a reference clock. The multi-vibrator coupled to the biasing circuit for generating the oscillating frequency according to the quantity of the biasing signal. The detecting circuit coupled to the connecting port for generating a detecting signal whether the connecting port is coupled to the impedance device or the external clock source. The selecting circuit includes an AND gate coupled to the multi-vibrator and the selection signal and an OR gate coupled to the AND gate and the connecting port.

13 Claims, 5 Drawing Sheets

OSCILLATING APPARATUS WITH ADJUSTABLE OSCILLATING FREQUENCY

BACKGROUND OF THE INVENTION

1. Field of the Invention

The present invention is related to an oscillating apparatus, and more particularly, to an adjustable oscillating frequency and oscillating apparatus with high power supply rejection.

2. Description of the Prior Art

In digital electronic devices, a clock generator is used for generating a clock signal, in which the clock signal is utilized as a reference clock for the digital circuit application. Normally, an external low-frequency clock source (e.g. a crystal oscillator) is utilized to generate a higher frequency clock inside the chip by a synthesizer. A self-resonated circuit within the chip generates reference clocks for some digital electronic devices. The former requires an off-chip oscillating device, and a synthesizer, which is implemented by a phase locked loop circuit; however the latter only requires a simple self-resonated structure, thus the latter is widely used in the driver of the small sized thin film transistor-liquid crystal display (TFT-LCD). Therefore, the chip area and power consumption of the latter are smaller than that of the former.

Ideally, when the self-resonated circuit oscillates, the resistor-capacitor (RC) value and the amplifier configuration within the self-resonated circuit will decide the range of the oscillating frequencies. However the variation of the external environment, such as supply voltage, manufacturing process, and temperature will change the oscillation condition of the self-resonated circuit and consequently cause a shift of the oscillating frequency from ideal conditions.

The oscillating period (T) of an oscillator can be approximated as $$T = (2CV_{SW})/I + (X_{non\text{-}linear\ term}) = 2RC + (X_{non\text{-}linear\ term}),$$

wherein C is a charging/discharging capacitor, $V_{SW}$ is signal amplitude in the capacitor, and I is the average current. $X_{non\text{-}linear\ term}$ is a non-linear factor from voltage swing and current, and the active device also induces some non-linear effects.

Accordingly, the external environment is changed, the value of $V_{SW}$, and I are also changed to cause the departure of the frequency of the oscillating signal from an ideal condition. Thus, the frequency derivation would be reduced by the external fixed resistance that generated the biasing current of the oscillator. The linear relationship between resistance and $V_{SW}/I$ in the oscillator portion would reflect the variation of oscillated frequency. Furthermore, the departure of oscillating frequency is apparently affected by the non-linear term that includes oscillator configurations and circuit limitations.

SUMMARY OF THE INVENTION

It is therefore one of the objectives of the claimed invention to provide an oscillating apparatus with adjustable oscillating frequency and high power supply rejection ratio mechanisms to solve the above-mentioned problems.

According to the present invention, an oscillating apparatus is disclosed. The oscillating apparatus comprises: a biasing circuit and a multi-vibrator. The biasing circuit is employed for dynamically adjusting a bias quantity of the oscillating apparatus; the multi-vibrator, coupled to the biasing circuit, is to generate an oscillating signal according to the biasing signal.

According to the present invention, an oscillating apparatus is disclosed. The oscillating apparatus comprises: a biasing circuit, an oscillator, an impedance device, a detecting circuit, and a selecting circuit. In which the biasing circuit generates a biasing signal; the oscillator coupled to the biasing circuit, for generating an oscillating signal; and the impedance device coupled to the biasing circuit for controlling a frequency of the oscillating signal; wherein the biasing circuit and the oscillator are positioned on a chip. The impedance device is off-chip or on-chip. Thus, the impedance device is for controlling a frequency of an oscillating signal or for coupling a clock source to receive a reference clock. The detecting circuit, coupled to the connecting port, is for detecting whether the connecting port is coupled to the impedance component or the clock source. The selecting circuit, comprising an AND gate coupled to the oscillator output and the selection signal, is for blocking the internal oscillating signal while there exists an external clock source. An OR gate, coupled to the AND gate output and the connecting port, is for bypassing the signal from an internal oscillator or external clocking reference.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
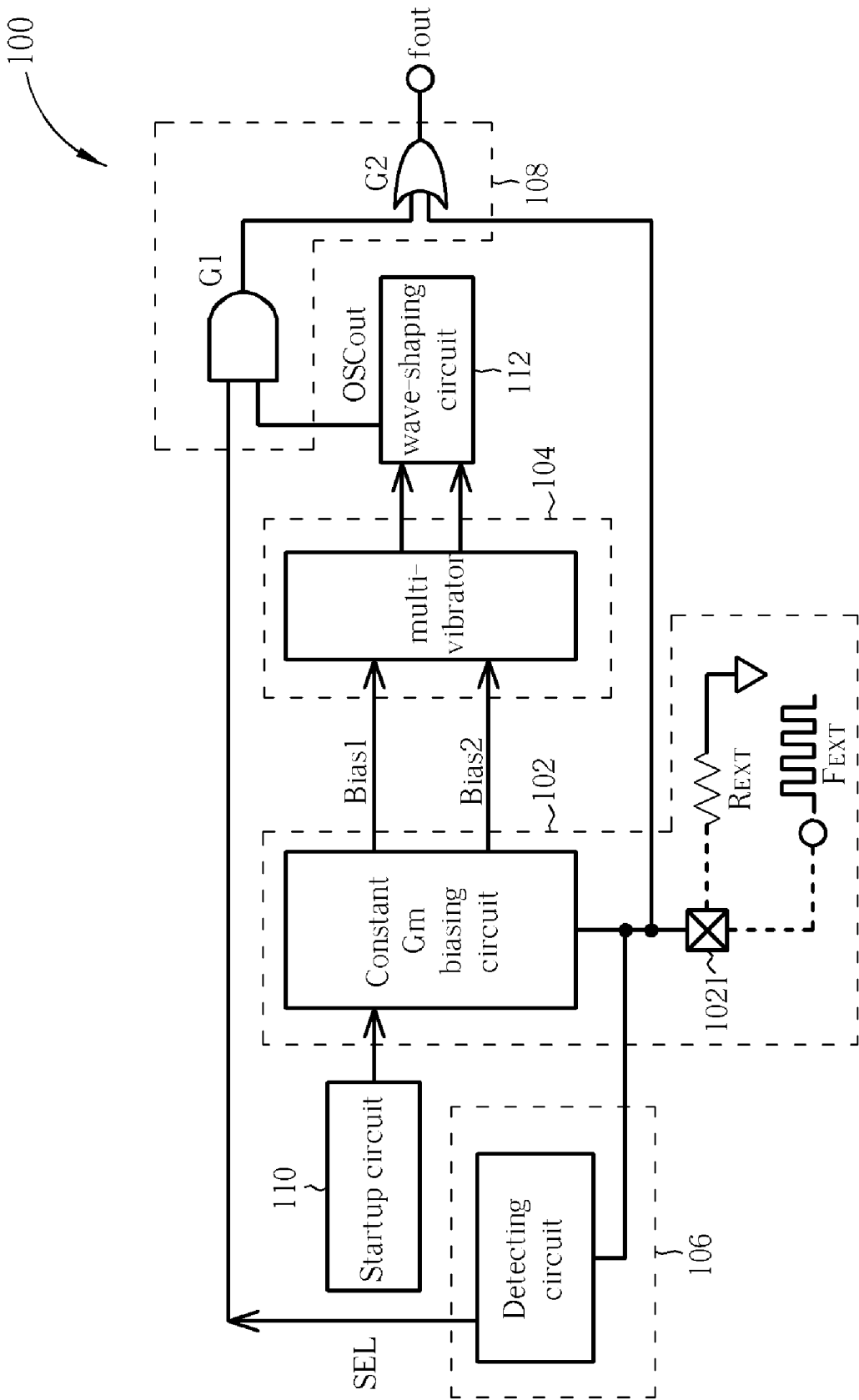
FIG. 1 illustrates an oscillating apparatus according to an embodiment of the present invention.

FIG. 1 illustrates an oscillating apparatus 100 according to an embodiment of the present invention. The oscillating apparatus 100 comprises a constant Gm biasing circuit 102 (consists a connector 1021), a multi-vibrator 104, a detecting circuit 106, a selective circuit 108, a startup circuit 110, and a wave-shaping circuit 112. The multi-vibrator 104 is coupled to the constant Gm biasing circuit 102, the detecting circuit 106 is coupled to the connector 1021, the selective circuit 108 comprises an AND gate G1 coupled to the multi-vibrator 104 and a selective signal, and an OR gate G2 coupled to the AND gate G1 and the connector 1021. In the embodiment, the constant Gm biasing circuit 102 is used for generating a first bias signal Bias1 and a second bias signal Bias2, wherein the connector 1021 is used for coupling an off-chip resistor $R_{EXT}$ to control oscillating frequency of a oscillating signal $OSC_{OUT}$ or coupling a clock source to receive a reference clock $F_{EXT}$; the multi-vibrator 104 is used for generating the required oscillating signal $OSC_{OUT}$ according to the first bias signal Bias1 and the second bias signal Bias2; the detecting circuit 106 is used for detecting whether the connector 1021 is coupled to the resistor $R_{EXT}$ or the reference clock $F_{EXT}$ for generating a selective signal SEL; the selective circuit 108 is used for selectively outputting the oscillating signal $OSC_{OUT}$ or the reference clock $F_{EXT}$; the startup circuit 110 guarantees that the constant Gm biasing circuit 102 is workable at normal operation mode, and the wave-shaping circuit 112 is used for pulling the level of the output signal of the multi-vibrator 104 into the digital voltage level.

Figure 2:
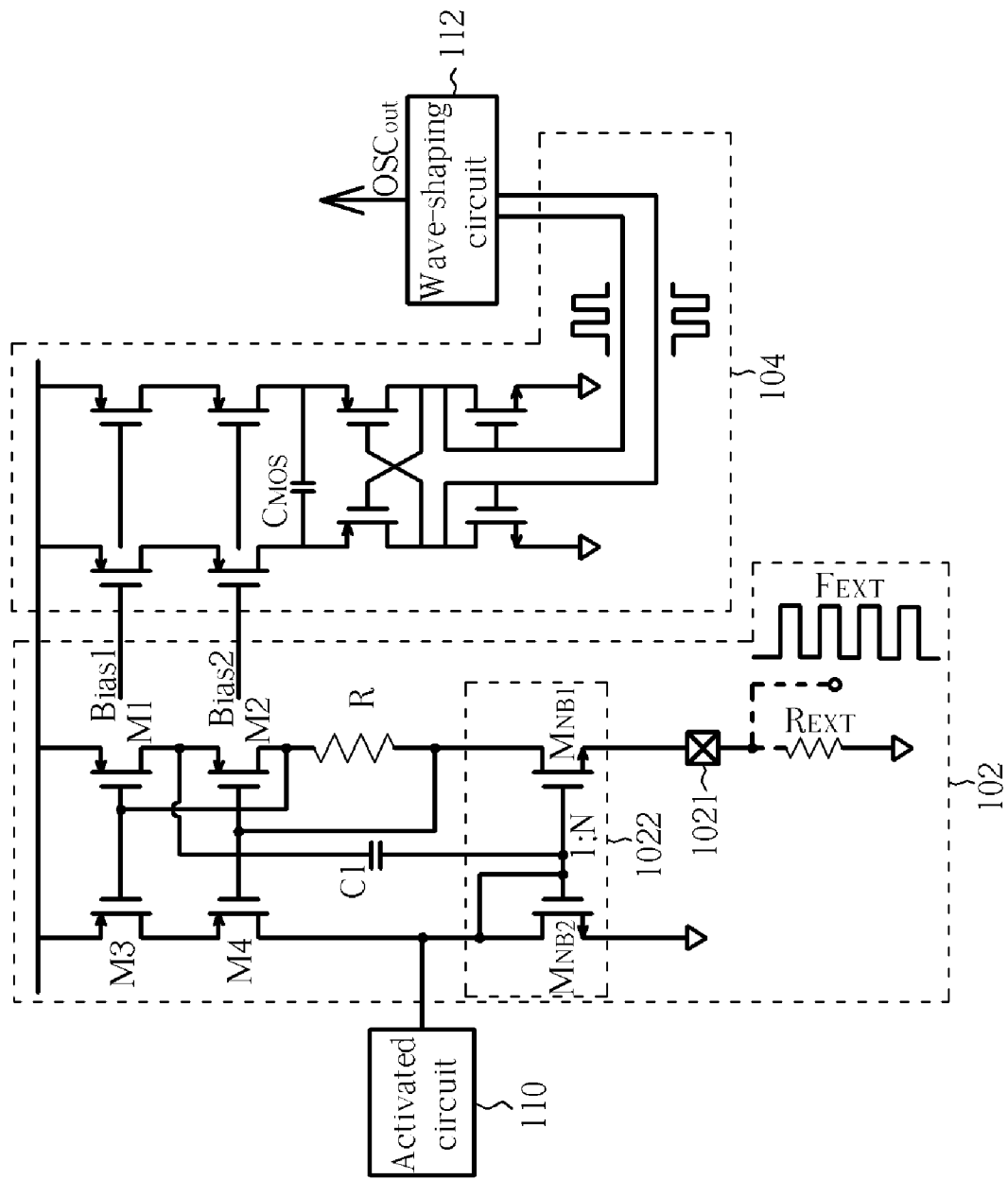
FIG. 2 illustrates an embodiment of the constant Gm biasing circuit and the multi-vibrator of FIG. 1.

FIG. 2 illustrates an embodiment of the constant Gm biasing circuit 102 and the multi-vibrator 104 of FIG. 1. In the embodiment of the constant Gm biasing circuit 102, comprises a resistor R; a cascoded structure, comprising a transistor M1 cascoded with a transistor M2, wherein gate terminals of the transistors M1, M2 are coupled to the two terminals of the resistor R, respectively; a second cascoded structure, comprising a transistor M3 cascoded with a transistor M4, thus M1~M4 transistors are formed as a high-impedance PMOS current mirror; an NMOS current mirror 1022, comprising transistors $M_{NB1}$, $M_{NB2}$, wherein a current path of the current mirror 1022 are coupled to the connector 1021; and a capacitor C1, with two terminals is coupled between the transistor M1 and transistor $M_{NB2}$. In the embodiment, the multi-vibrator 104 is well-known to those having average skill in this art, and is specifically a voltage-controlled oscillator with a cross-coupled capacitor $C_{MOS}$, in which the voltage-controlled oscillator is controlled by the bias signal Bias1 and Bias2, therefore, further details are omitted for the sake of brevity.

Accordingly, when the oscillating apparatus 100 utilizes the off chip resistor $R_{EXT}$ to generate the oscillating signal $OSC_{OUT}$, the oscillating frequency $f_{osc}$ of the multi-vibrator 104 approaches:

$$f_{osc} = \frac{1}{2} \Pi (R_{EXT} C_{MOS}),$$

wherein the channel width ratio of the transistors $M_{NB1}$, $M_{NB2}$ within the current mirror 1022 is 1:N, and because $V_{gs(NB2)} = V_{gs(NB1)} + I^* R_{EXT}$ in the constant Gm biasing circuit 102, thus the biasing current I that pass through the resistor R is:

$$I = (2/((U_n C_{ox})(W/L)_{NB1}))^* (1/R_{EXT})^* ((1-(1/N^{1/2}))^2).$$

According to the equation of I, the biasing current I of the constant Gm biasing circuit 102 can be adjusted according to resistance of the resistor R. Accordingly, the oscillating apparatus 100 of the present invention has a better biasing current-oscillating signal transfer characteristic that reduces/improves the power supply rejection (PSR). In other words, the utilization of cascoded PMOS transistor improves the operation of biasing current to the power noise.

Because the connector 1021 is selectively coupled to the off-chip resistor $R_{EXT}$ or reference clock $F_{EXT}$, thus a large parasitic capacitor will exist at the connector 1021, in which the parasitic capacitor and the off-chip resistor $R_{EXT}$ form a zero. The zero will cause the constant Gm biasing circuit 102 be unstable. In order to improve the unstable condition of the constant Gm biasing circuit 102, a capacitor should be connected to the common gate terminal of the transistors $M_{NB1}$, $M_{NB2}$, and the capacitance of the capacitor should be 1/(N)^(½) of the parasitic capacitance of the connector 1021 to form a capacitance compensation circuit at the constant Gm biasing circuit 102. Accordingly, the embodiment utilizes the concept of Miller compensation to eliminate the value of the compensated capacitance effectively. As shown in FIG. 2, a compensated capacitor C1 is coupled between the drain terminal of the first transistor M1 and the common gate terminal of the transistors $M_{NB1}$, $M_{NB2}$.

Figure 3:
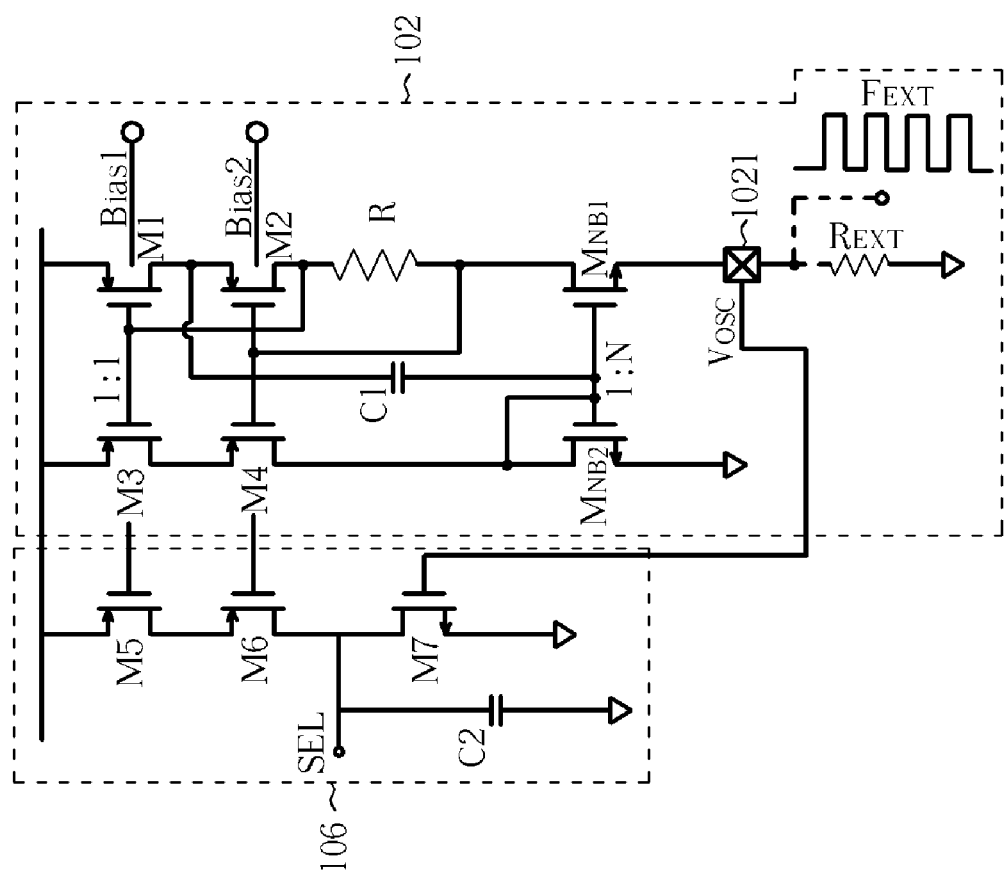
FIG. 3 illustrates an embodiment of the detecting circuit of FIG. 1.
Figure 4:
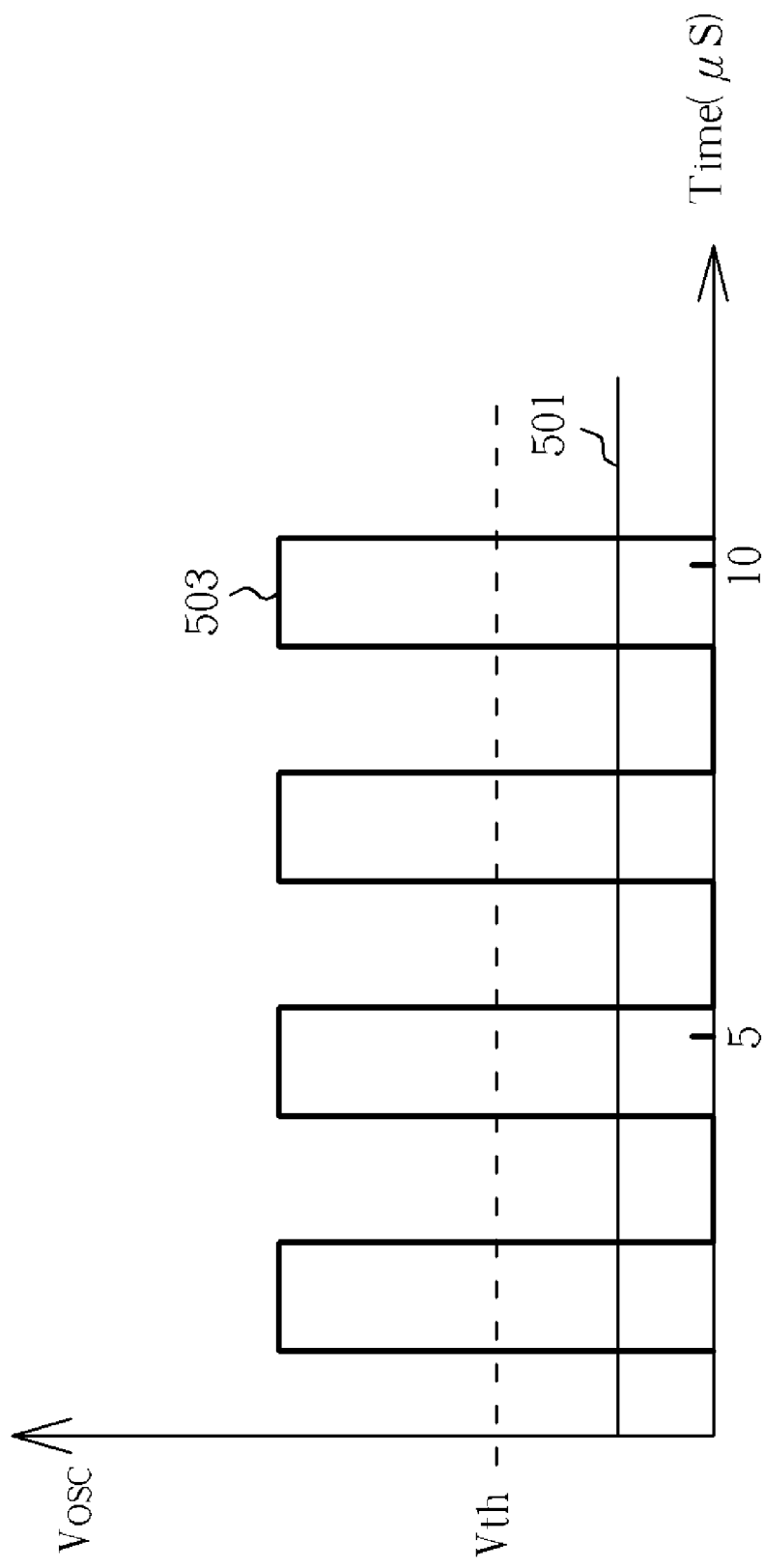
FIG. 4 illustrates a waveform of the voltage of connector within the detecting circuit of FIG. 3.
Figure 5:
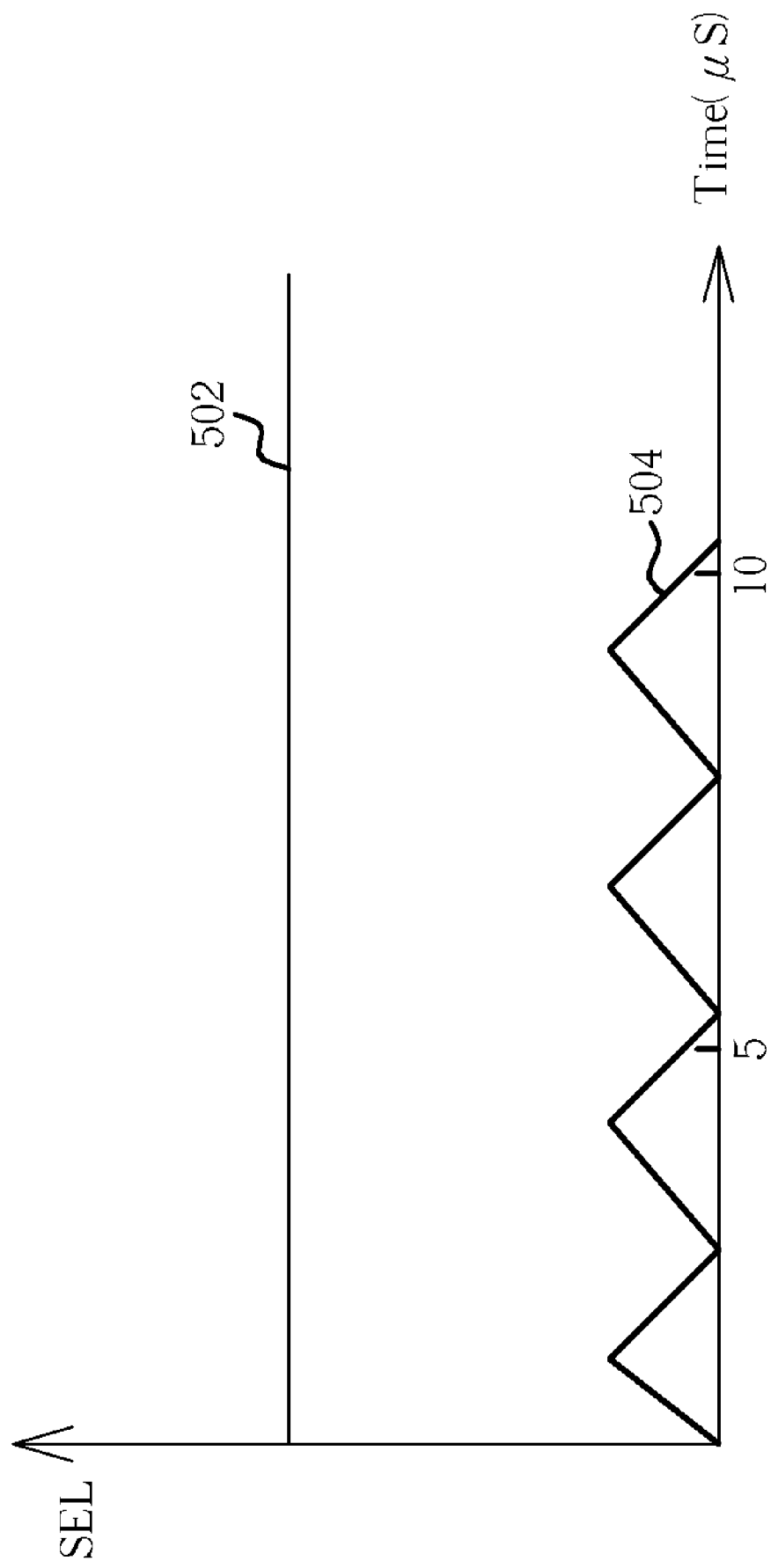
FIG. 5 illustrates a waveform of the selective signal within the detecting circuit of FIG. 3.

FIG. 3 illustrates an embodiment of the detecting circuit 106 of FIG. 1. In the embodiment, the detecting circuit 106 comprises a capacitor C2, charged transistors M5, M6, and discharged transistor M7. In which the gate terminal of the transistor M7 is coupled to the connector 1021, the drain terminal is coupled to the capacitor C2 and transistors M5, M6 to generate a selective signal SEL. FIG. 4 illustrates a waveform of detecting signal transferred from the voltage $V_{osc1}$ input format. FIG. 5 illustrates an output waveform of the selective signal SEL within the detecting circuit 106 of FIG. 3. When the connector 1021 is coupled to the off-chip resistor $R_{EXT}$, the output of detecting circuit 106 will cause the voltage $V_{osc1}$ of the connector 1021 to be lower than the threshold voltage (Vth) of the transistor M7, as shown in waveform 501 of FIG. 4. Accordingly, the transistor M7 is off, and the conducting of the transistors M5, M6 will charge the capacitor C2 to a high voltage level, which causes the selective SEL to also be at a high voltage level, as shown waveform 502 of FIG. 5. Alternatively, when the connector 1021 is coupled to the reference clock $F_{EXT}$, as shown in waveform 503 of FIG. 4, because the reference clock $F_{EXT}$ causes the transistor M7 to be in an on state in a half-period and off in a other half-period, thus the transistors M5, M6 will charge the capacitor C2 to be higher than the voltage level of the selective signal SEL when the transistor M7 is off; furthermore, the equivalent circuit of the embodiment will discharge the capacitor C2 to lower the voltage level of the selective signal SEL when the transistor M7 is on. The voltage level variation of the selective signal SEL is waveform 504 of FIG. 5. Accordingly, when the connector 1021 is coupled to the reference clock $F_{EXT}$, the voltage level of the selective signal SEL is lower than the threshold voltage (VTH) and can be treated as low logic level "0", and when the connector 1021 is coupled to the off-chip resistor $R_{EXT}$, the voltage level of the selective signal SEL is higher and can be treated as high logic level "1". Therefore, when the selective signal SEL is high logic level "1", the output signal $f_{out}$ of the selective circuit 108 be the oscillating signal $OSC_{OUT}$ that via the wave-shaping circuit 112, and when the selective signal SEL is low logic level "0", the output signal $f_{out}$ of the selective circuit 108 will be the reference clock $F_{EXT}$ from off-chip.

Accordingly, the embodiment according to the present invention is able to adjust the oscillating frequency of the oscillating signal $OSC_{out}$ through the off-chip resistor $R_{EXT}$, or provide the reference clock $F_{EXT}$ from off-chip; furthermore, the selectivity connection of off-chip resistor $R_{EXT}$ or reference clock $F_{EXT}$ can be detected by the on-chip detecting circuit 106. The detecting circuit 106 controls the selective circuit 108 to select one of the self-resonated oscillating signal $OSC_{OUT}$ or off-chip reference clock $F_{EXT}$ as the required output signal $f_{out}$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillating apparatus, comprising:
    a biasing circuit, for dynamically adjusting a bias signal of the oscillating apparatus, comprising:

a connecting port, for coupling an impedance device to control a frequency of an oscillating signal or for coupling a clock source to receive a reference clock;

a detecting circuit, coupled to the connecting port, for detecting whether the connecting port is coupled to the impedance device or the clock source for generating a selection signal;

a selecting circuit, comprising an AND gate coupled to a multi-vibrator and the selection signal, and an OR gate coupled to the AND gate and the connecting port; and the multi-vibrator, coupled to the biasing circuit, for generating the oscillating signal according to the biasing signal.

2. The apparatus of claim 1, wherein the biasing circuit comprises:

a first impedance device;

a first cascoded transistor, comprising a first transistor cascoded on a second transistor, a first terminal of the first transistor coupled to a first voltage level, a second terminal of the first transistor coupled to a first terminal of the second transistor, a second terminal of the second transistor coupled to a control terminal of the first transistor, control terminals of the first and second transistors coupled to two ends of the first impedance device, respectively;

a second cascoded transistor, comprising a third transistor cascoded on a fourth transistor, a first terminal of the third transistor coupled to the first voltage level, a second terminal of the third transistor coupled to the first terminal of the fourth transistor; and a current mirror, comprising: a first current path, couple to second terminal of the fourth transistor and a second voltage level; and a second current path, couple to the control terminal of the second transistor and the second voltage level.

3. The apparatus of claim 2 further comprising:

a second impedance device, having two ends coupled to the second current path and the second voltage level respectively, for controlling a frequency of the oscillating signal.

4. The apparatus of claim 3, wherein the biasing circuit and the multi-vibrator are positioned in a chip, and the second impedance device is positioned off the chip.

5. The apparatus of claim 2, wherein the biasing circuit further comprises:

a capacitor device, having two ends coupled to the first current path and the second terminal of the first transistor, for avoiding the biasing circuit from oscillating.

6. The apparatus of claim 1, wherein the detecting circuit generates the selection signal according to a voltage level at the connecting port.

7. The apparatus of claim 6, wherein the detecting circuit comprises:

a capacitor device; and a transistor, having a control terminal coupled to the connecting, a first terminal coupled to a first voltage level of the capacitor for outputting the selection signal, and a second terminal coupled to a second voltage level.

8. An oscillating apparatus, comprising:

a biasing circuit, for generating at least a biasing signal, wherein the biasing circuit comprises a connecting port, for coupling an impedance device to control a frequency of an oscillating signal or for coupling a clock source to receive a reference clock;

a detecting circuit, coupled to the connecting port, for detecting whether the connecting port is coupled to the impedance device or the clock source for generating a selection signal;

a selecting circuit, comprising an AND gate coupled to an oscillator and the selection signal, and an OR gate coupled to the AND gate and the connecting port; and the oscillator, coupled to the biasing circuit, for generating the oscillating signal according to the biasing signal.

9. The apparatus of claim 8, wherein the detecting circuit generates the selection signal according to a voltage level at the connecting port.

10. The apparatus of claim 9, wherein the detecting circuit comprises:

a capacitor device; and a transistor, having a control terminal coupled to the connecting port, a first terminal coupled to a first voltage level of the capacitor for outputting the selection signal, and a second terminal coupled to a second voltage level.

11. An oscillating apparatus, comprising:

a biasing circuit, for dynamically adjusting a bias signal of the oscillating apparatus, comprising:

a first impedance device;

a first cascoded transistor, comprising a first transistor cascoded on a second transistor, a first terminal of the first transistor coupled to a first voltage level, a second terminal of the first transistor coupled to a first terminal of the second transistor, a second terminal of the second transistor coupled to a control terminal of the first transistor, control terminals of the first and second transistors coupled to two ends of the first impedance device, respectively;

a second cascoded transistor, comprising a third transistor cascoded on a fourth transistor, a first terminal of the third transistor coupled to the first voltage level, a second terminal of the third transistor coupled to the first terminal of the fourth transistor; and a current mirror, comprising:

a first current path, coupled to a second terminal of the fourth transistor and a second voltage level; and a second current path, coupled to the control terminal of the second transistor and the second voltage level;

a multi-vibrator, coupled to the biasing circuit, for generating an oscillating signal according to the biasing signal; and a second impedance device, having two ends coupled to the second current path and the second voltage level respectively, for controlling a frequency of the oscillating signal.

12. The apparatus of claim 11, wherein the biasing circuit and the multi-vibrator are positioned in a chip, and the second impedance device is positioned off the chip.

13. An oscillating apparatus, comprising:

a biasing circuit, for dynamically adjusting a bias signal of the oscillating apparatus, comprising:

a first impedance device;

a first cascoded transistor, comprising a first transistor cascoded on a second transistor, a first terminal of the first transistor coupled to a first voltage level, a second terminal of the first transistor coupled to a first terminal of the second transistor, a second terminal of the second transistor coupled to a control terminal of the first transistor, control terminals of the first and second transistors coupled to two ends of the first impedance device, respectively;

a second cascoded transistor, comprising a third transistor cascoded on a fourth transistor, a first terminal of the third transistor coupled to the first voltage level, a second terminal of the third transistor coupled to the first terminal of the fourth transistor;

a current mirror, comprising:

a first current path, coupled to a second terminal of the fourth transistor and a second voltage level; and a second current path, coupled to the control terminal of the second transistor and the second voltage level; and a capacitor device, having two ends coupled to the first current path and the second terminal of the first transistor, for avoiding the biasing circuit from oscillating;

a multi-vibrator, coupled to the biasing circuit, for generating an oscillating signal according to the biasing signal; and a second impedance device, having two ends coupled to the second current path and the second voltage level respectively, for controlling a frequency of the oscillating signal.

* * * * *